(12) United States Patent
Pesic et al.

(10) Patent No.: US 10,692,689 B2
(45) Date of Patent: Jun. 23, 2020

(54) IMAGE CAPTURE ASSEMBLY AND METHOD FOR ELECTRON BACK SCATTER DIFFRACTION

(71) Applicant: VG Systems Limited, Altrincham (GB)

(72) Inventors: Zoran Pesic, Altrincham (GB); Chris Stephens, Altrincham (GB); Austin Day, Monmouth (GB); Bryan Barnard, Altrincham (GB)

(73) Assignee: VG Systems Limited, Altrincham (GB)

( * ) Notice: Subject to any disclaimer, the term of this patent is extended or adjusted under 35 U.S.C. 154(b) by 0 days.

(21) Appl. No.: 15/837,587

(22) Filed: Dec. 11, 2017

(65) Prior Publication Data
US 2018/0166253 A1  Jun. 14, 2018

(30) Foreign Application Priority Data

Dec. 12, 2016 (GB) .................................. 1621105.4

(51) Int. Cl.
*G01T 1/164* (2006.01)
*H01J 37/22* (2006.01)
(Continued)

(52) U.S. Cl.
CPC .......... *H01J 37/224* (2013.01); *H01J 37/222* (2013.01); *H01J 37/244* (2013.01); *H01J 37/28* (2013.01);
(Continued)

(58) Field of Classification Search
CPC ........... G01N 21/6428; G01N 21/6458; G01N 21/64; G01N 21/6408; G01N 2021/6421
See application file for complete search history.

(56) References Cited

U.S. PATENT DOCUMENTS 6,326,619 B1 * 12/2001 Michael .............. H01J 37/2955
250/307
2010/0140487 A1 6/2010 Barrett et al.
(Continued)

FOREIGN PATENT DOCUMENTS

CN 102937510 2/2013
JP H08285947 11/1996

OTHER PUBLICATIONS

Wright et al. "Electron imaging with an EBSD detector" Elsevier, Ultramicroscopy 148 (2015) 132-145.*
(Continued)

*Primary Examiner* — David P Porta
*Assistant Examiner* — Mamadou Faye
(74) *Attorney, Agent, or Firm* — William R. McCarthy, III (57) ABSTRACT

The invention relates to an image capture assembly and method for use in an electron backscatter diffraction (EBSD) system. An image capture assembly comprises a scintillation screen (10) including a predefined screen region (11), an image sensor (20) comprising an array of photo sensors and a lens assembly (30). The image capture assembly is configured to operate in at least a first configuration or a second configuration. In the first configuration the lens assembly (30) projects the predefined region (11) of the scintillation screen (10) onto the array and in the second configuration the lens assembly (30) projects the predefined region (11) of the scintillation screen (10) onto a sub-region (21) of the array. In each of the first and second configurations the field of view of the lens assembly (30) is the same.

20 Claims, 5 Drawing Sheets

(51) Int. Cl.
*H01J 37/244* (2006.01)
*H01J 37/295* (2006.01)
*H01J 37/28* (2006.01)

(52) U.S. Cl.
CPC ....... *H01J 37/295* (2013.01); *H01J 2237/024* (2013.01); *H01J 2237/10* (2013.01); *H01J 2237/2443* (2013.01); *H01J 2237/24475* (2013.01); *H01J 2237/2804* (2013.01); *H01J 2237/2805* (2013.01)

(56) References Cited

U.S. PATENT DOCUMENTS

2014/0209911 A1* 7/2014 Kawashima ...... H01L 21/02422
  257/66
2014/0293015 A1* 10/2014 Hess ........................ G01B 9/04
  348/49
2016/0054240 A1* 2/2016 Uncovsk .............. G01N 23/203
  250/307

OTHER PUBLICATIONS

Schwarzer et al. "Present State of Electron Backscatter Diffraction and Prospective Developments" Institute of Physics, Clausthal University of Technology, Germany, Springer Science+Business Media, LLC 2009 p. 1-20 (Year: 2009).*

Britton et al. "Factors affecting the accuracy of high resolution electron backscatter diffraction when using simulated patterns", Elsevier, Ultramicroscopy 110 (2010) p. 1443-1453. (Year: 2010).*

* cited by examiner

IMAGE CAPTURE ASSEMBLY AND METHOD FOR ELECTRON BACK SCATTER DIFFRACTION

CROSS-REFERENCE TO RELATED APPLICATION

This application claims the priority benefit under 35 U.S.C. § 119 to British Patent Application No. 1621105.4, filed on Dec. 12, 2016, the disclosure of which is incorporated herein by reference.

The invention relates to an image capture assembly and method for use in an electron backscatter diffraction (EBSD) system.

High resolution electron and x-ray imaging techniques commonly use "phosphor" scintillation screens to convert incident radiation into visible photons. The term "phosphor" refers to a group of widely known scintillation materials. Such materials are known from Phosphors Handbook, William, M. Yen, Shigeo Shionoya, and Hajime Yamamoto, Eds., Boca Raton, Fla.: CRC Press, 2007, 2nd ed. It is known to use a fixed focal length lens to project light from the screen onto a camera sensor. Also known is the use of an optical fibre face plate, which may be tapered, in order to couple a screen and camera with fixed magnification. Furthermore it is known that in some applications a conventional zoom lens may be used to image a variable region of the screen onto the sensor and thereby to magnify the image from a smaller part of the screen.

Such an indirect electron detection method is used in electron backscatter diffraction to image detected electron backscatter diffraction patterns (EBSPs), which can provide micro-structural information such as texture, crystallographic phase, grain morphology and deformation as described in Electron Backscatter Diffraction in Materials Science, ed. Adam J. Schwartz, Mukul Kumar, Brent L. Adams and David P. Field (Springer Science+Business Media, LLC, 2009,) ISBN: 0387881352.

During an EBSD analysis, a beam of electrons, typically from an electron microscope, is directed onto a sample in a vacuum chamber. The electrons are backscattered from crystal planes within the sample, which constructively or destructively interfere in accordance with Braggs law to form an electron backscatter diffraction pattern. A portion of the scattered (diffracted) electrons from the sample strike a screen, typically a phosphor screen. The electrons collide with the screen which fluoresces and the resulting light may be detected using a lens assembly and a camera. The most common EBSD applications are crystal orientation image mapping (OIM) to measure microstructure, phase analysis to fingerprint the unit cell, and EBSP cross-correlation for strain analysis. In some applications the image resolution is or primary importance while in others low resolution images are sufficient to determine the crystal orientation and hence the speed of acquisition is more important as explained in Electron Backscatter Diffraction in Materials Science, ed. Adam J. Schwartz, Mukul Kumar, Brent L. Adams and David P. Field (Springer Science+Business Media, LLC, 2009,) ISBN: 0387881352. As the EBSP resolutions for different applications varies from as low as 80×60 pixels, up to a few Megapixels, in practice, it is necessary to use different EBSD systems with different combinations of lens and cameras for each of these applications since one EBSD system can only operate in one of these modes. Alternatively, "binning" or "decimation" may be used in the sensor (binning involves combining data from neighbouring pixels, whereas decimation involves reading only a subset of the available pixels) to provide an increased speed of acquisition at the expense of image resolution. Although possible, binning and decimation do not need to be applied equally in the X and Y directions of the sensor. For example, binning or decimation may be used to reduce the X dimension by a greater factor than the Y dimension.

According to a first aspect of the invention there is provided an image capture assembly comprising: a scintillation screen including a predefined screen region; an image sensor comprising an array of photo sensors; and a lens assembly.

Such an image capture assembly can be configured to provide the optimum combination of acquisition speed and image resolution for a variety of applications. The invention can therefore enable operation with either requirement (high resolution or high speed) using a single, variable image capture assembly.

The image capture assembly is configured to operate in at least a first configuration or a second configuration. In the first configuration the lens assembly projects the predefined region of the scintillation screen onto the array. In the second configuration the lens assembly projects the predefined region of the scintillation screen onto a sub-region of the array.

The sub-region of the array is preferably a central sub-region of the array, i.e. positioned centrally within the array. The lens can produce different image sizes on the sensor in each configuration of operation. In preferred embodiments, the lens can produce different image sizes on the sensor for a fixed predefined region of the scintillation screen (i.e. a fixed field of view).

Advantageously, such an assembly can be used in the first configuration for phase analysis and/or cross-correlated strain analysis and in the second configuration for orientational mapping.

According to a second aspect of the invention there is provided an image capture method for an EBSD system, the method comprising the steps of: projecting light from a predefined screen region of a scintillation screen onto an image sensor comprising an array of photo sensors using a lens assembly in a first configuration, and capturing an image using the array; changing the configuration of the lens assembly between the first configuration to a second configuration; and projecting light from the predefined screen region onto a sub-region of the array of photo sensors using the lens assembly in the first configuration, and capturing an image using the sub-region of the array.

For a better understanding of the invention, and to show how the same may be put into effect, reference will now be made, by way of example only, to the accompanying drawings, in which.

As can be seen in the Figures, a preferred image capture assembly 1 comprises a scintillation screen 10, an image sensor 20, and a lens assembly 30.

Preferably, the scintillation screen 10, the image sensor 20, and the lens assembly 30 are housed in a housing 50.

The scintillation screen 10, the image sensor 20, and the lens assembly 30 are preferably all centered on an axis Z, along which they are spaced apart. Similarly, the scintillation screen 10, the image sensor 20, and the lens assembly 30 are preferably all arranged to extend in a plane perpendicular to, the axis Z.

The axis Z may be a longitudinal axis of the housing 50, which is preferably elongate.

The image capture assembly 1 may form part of an electron backscatter diffraction (EBSD) system, which includes beam generating means, such as a scanning electron microscope (SEM), for generating an electron beam and sample holding means for holding a sample to be analysed. For example, as described in Electron Backscatter Diffraction in Materials Science, ed. Adam J. Schwartz, Mukul Kumar, Brent L. Adams and David P. Field (Springer Science+Business Media, LLC, 2009,) ISBN: 0387881352.

In an EBSD system, the beam generating means and sample holding means are preferably housed within an evacuated analysis chamber. The EBSD system is configured such that at least some of the electrons from the beam generating means that are scattered by a sample held in the sample holding means will strike the scintillation screen 10. An electron backscatter diffraction pattern can be formed on the scintillation screen. The scintillation screen 10 is arranged to convert incident electrons into visible light and can thereby form an image on the scintillation screen.

The scintillation screen 10 includes a predefined screen region 11. The predefined screen region 11 defines the area of interest for the analysis. Typically, the predefined screen region 11 will be as large as possible, and so the predefined screen region 11 may be the whole scintillation screen 10.

Preferably, the scintillation screen 10 is a phosphor screen. The phosphor material will preferably be selected with an emission wavelength to be matched with the camera spectral response and with a speed of response to match the fastest acquisition speed required. For example, the phosphors known as P20, P22G and P43 may be used. Single crystal scintillators, such as YAG may also be used.

The size of the screen 10 may be for example, around 35 mm by 28 mm. While other sizes are possible, the screen may be as small as 28 mm by 20 mm and as large as 48 mm by 34 mm. The screen can also be other than rectangular in some other embodiments, such as circular or elliptical for example.

The image sensor 20 comprises an array of photo sensors. Typically, the array is a rectangular array comprising a plurality of rows of photo sensors. Preferably, the array constitutes the entire image sensor 20.

There is defined in the array a sub-region of the array 21. For example, the array may have a resolution of at least 1 megapixel, or at least 2 megapixels, or at least 3 megapixels, or at least 4 megapixels and preferably at least 5 megapixels (e.g. 2560×2048 pixels), whereas the sub-array may have a resolution of up to 1 megapixel, preferably up to 400 kilopixels, and most preferably up to 100 kilopixels.

The image sensor 20 may be a CCD sensor or, more preferably, a CMOS sensor.

The size of the image sensor 20 may be for example, around 12.8 mm by 10.2 mm. A range of sizes suitable includes (but is not limited to) 1.9 mm to 25 mm by 1.5 mm to 20 mm.

The image sensor 20 may form a part of a camera 25. The camera 25 may comprise a processing means 26 for processing a signal from photo sensors of the image sensor 20 and providing output data representative thereof. The processing means 26 may be hardware, optionally combined with software, arranged to receive the output of the image sensor 20 and provide data representative thereof. For example, the processing means 26 may include an analogue to digital convertor (optionally, with noise filtering) and/or may be arranged to carry out binning, decimation and/or windowing, as described below.

The scintillation screen 10 is preferably spaced from the image sensor 20 by an amount in the range 80 mm to 300 mm.

The processing means 26 may sample the photo sensors in one of at least two modes. In the first mode the processing means may sample the photo sensors at a rate up to 500 frames per second and preferably up to 300, or up to 200, or up to 150 frames per second (for example at about 100 frames per second). In the second mode the processing means may sample the photo sensors at a rate of at least 1000 frames per second, preferably at a rate of at least 1500 frames per second, and more preferably at least 2000 frames per second. Preferably, the sampling rate in the second mode is higher than the sampling rate in the first mode.

The lens assembly 30 is arranged to direct light from the scintillation screen 10 onto the image sensor 20. The lens assembly 30 comprises one or more lens elements.

In preferred embodiments, the lens assembly 30 may be a reverse zoom lens. That is, it has the effect of projecting light emitted from the area of the scintillation screen 10 (i.e., the field of view) onto a smaller area of the image sensor 20. In other words, the field of view of the lens assembly 30 may be constant, with the area of projection on the image sensor 20 variable, in contrast to a standard lens which would focus a variable field of view onto a fixed image sensor.

Preferably, the lens assembly 30 is a variable focal length lens assembly. In such embodiments, the lens assembly may be configured in at least two configurations. Preferably, in a first configuration, the variable focal length lens assembly is set to a first focal length and thereby projects the predefined region 11 of the scintillation screen 10 onto the entire array. Preferably, in a second configuration, the variable focal length lens assembly is set to a second focal length and thereby projects the predefined region 11 of the scintillation screen 10 onto the sub-array. The second focal length is shorter than the first focal length. In some embodiments, there can be more than two configurations, i.e. the focal length of the lens assembly can be varied to provide more than two focal lengths. In some embodiments, the focal length can be varied in discrete steps whereas in other embodiments the focal length can be varied continuously.

Figure 3:
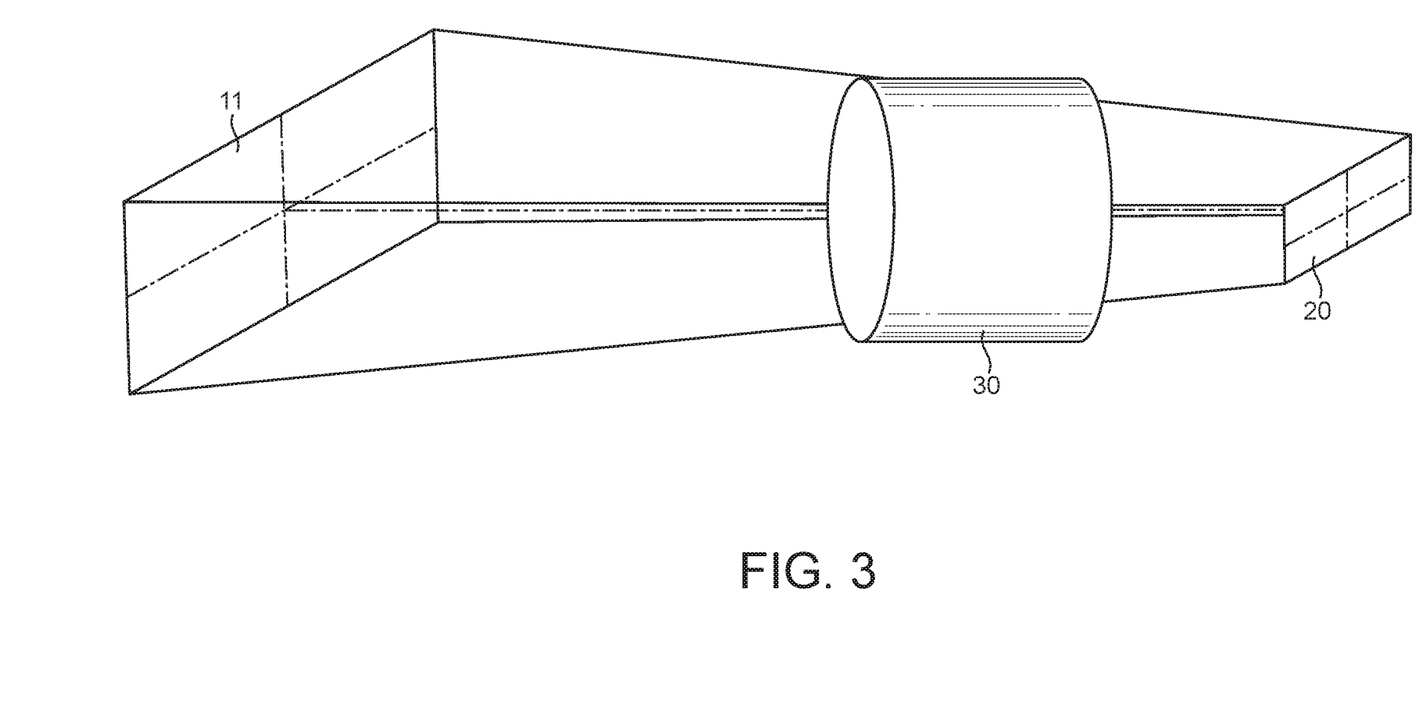
FIG. 3 shows a schematic representation of image capture in a first mode of operation in the image capture assembly of FIG. 1.

In a first configuration, shown schematically in FIG. 3, the variable focal length lens assembly projects the predefined region 11 of the scintillation screen 10 onto the array, which preferably corresponds with the whole image sensor 20. In some embodiments, a portion of the sensor may not be used, for example 100-200 pixels at the edge of the sensor may not be used. In one embodiment, for a sensor having a 2560× 2048 pixel array, leaving out 200 pixels around the edges leaves an array of 2160×1648 pixels onto which the predefined region 11 of the scintillation screen 10 is projected.

Figure 4:
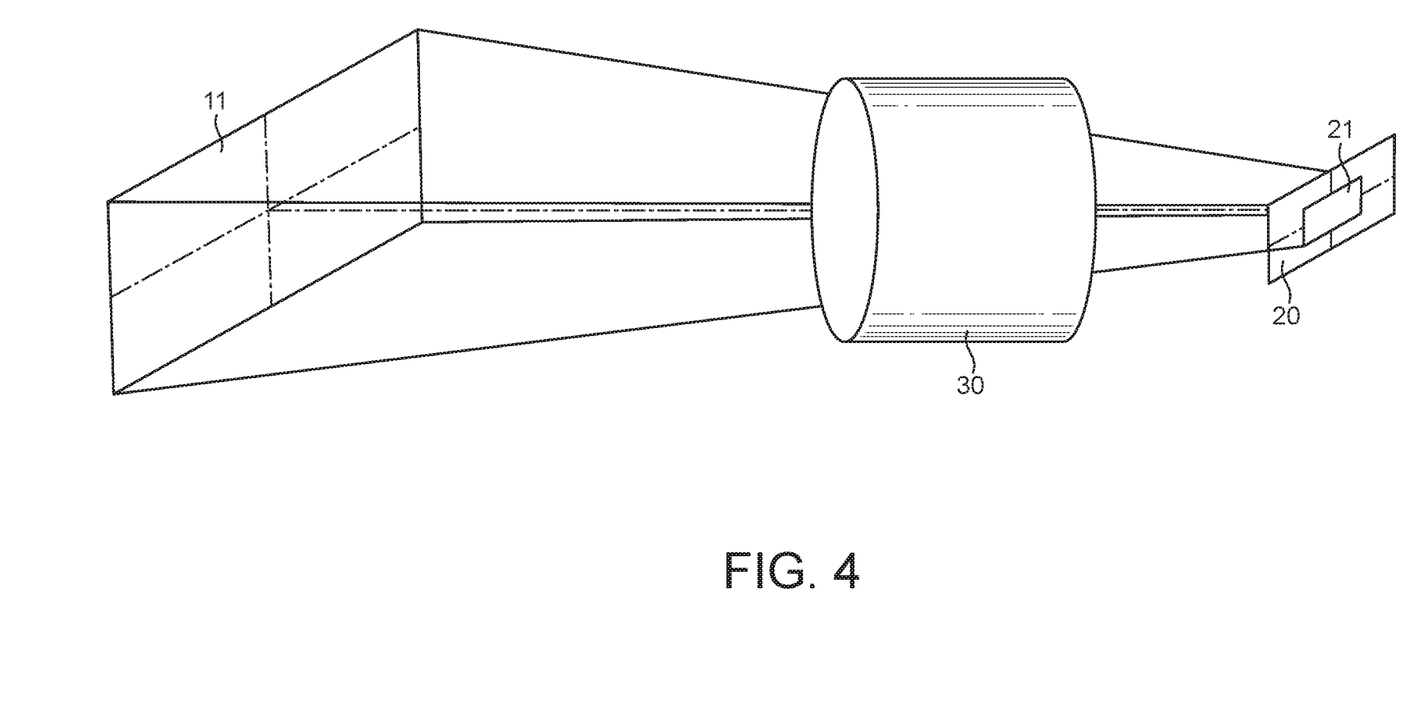
FIG. 4 shows a schematic representation of image capture in a second mode of operation in the image capture assembly of FIG. 1.

In a second configuration, shown schematically in FIG. 4, the variable focal length lens assembly projects the predefined region 11 of the scintillation screen 10 onto a sub-region 21 of the array. The sub-region of the sensor array may be up to 50%, but is preferably 0.1-10%, or 1-10%, or 1-5%, or 1-4%, or 1-3% of the array (as measured by area, which reflects the number of pixels in the array or sub-region), such as about 2% of the full array. However, other demagnifications are possible. The demagnification may be up to 24× and is preferably at least 3×, 4×, 5×, 6×, 7× or 8×. The demagnification may be in the range from 3× to 10×, such as 4× to 9× or such as from 5× to 8×, such as about 6×, or 7× or 8×. Preferably, the predefined region 11 is the whole scintillation screen 10. The predefined region 11 of the scintillation screen 10 (the field of view) remains substantially the same for each mode of operation, i.e. in each configuration of the assembly. This fixed region of the scintillation screen is imaged onto either the full sensor (array of photosensors) or a reduced region of the sensor (the sub-array).

As would be appreciated, the effect in the second configuration of projecting the image onto a smaller area also leads to a brighter image being formed on the image sensor 20 as the focal length of the lens assembly 30 is reduced, and thus the effective signal to noise ratio can be increased.

In preferred embodiments, the lens assembly is a motorized lens assembly. That is, the focal length can be adjusted by means of one or more actuators. The variable focal length lens assembly preferably comprises an actuator(s) for varying the lens assembly between a first arrangement in which it has a first focal length and a second arrangement in which it has a second focal length. However, it will be appreciated that in some embodiments the lens assembly can be adjusted manually to vary the focal length. This provides for a motorized change of position of individual lens elements to achieve the desired optical properties such as focal length selection. For example, the variable lens assembly 30 may comprise one or more actuators 32, which is arranged to vary the effect of the variable lens assembly 30. The actuator(s) 32 may move one or more lens elements of the lens assembly 30 (the zoom group of lenses) to thereby vary the magnification/demagnification of the lens assembly 30. Preferably, the lens elements are moved along the longitudinal axis Z. It is preferred to limit the number of moveable lens elements (or the number of moveable groups of elements) to not more than two. In the lens assembly, there is preferably provided a "zoom-elements group" of lens elements and a "focusing-elements group" of lens elements. Each group can have its own actuator (motor). A mechanical coupling of the "zoom-elements group" and "focusing-elements group" could enable use of one actuator (motor) only. It is preferable to avoid moving the sensor. Optionally, to improve the lens focusing properties, the lens assembly 30 may comprise a fixed or movable iris 31 (i.e. a controllable aperture). Such an iris 31 may be open by a greater amount in the second configuration than in the first configuration.

Figure 5:
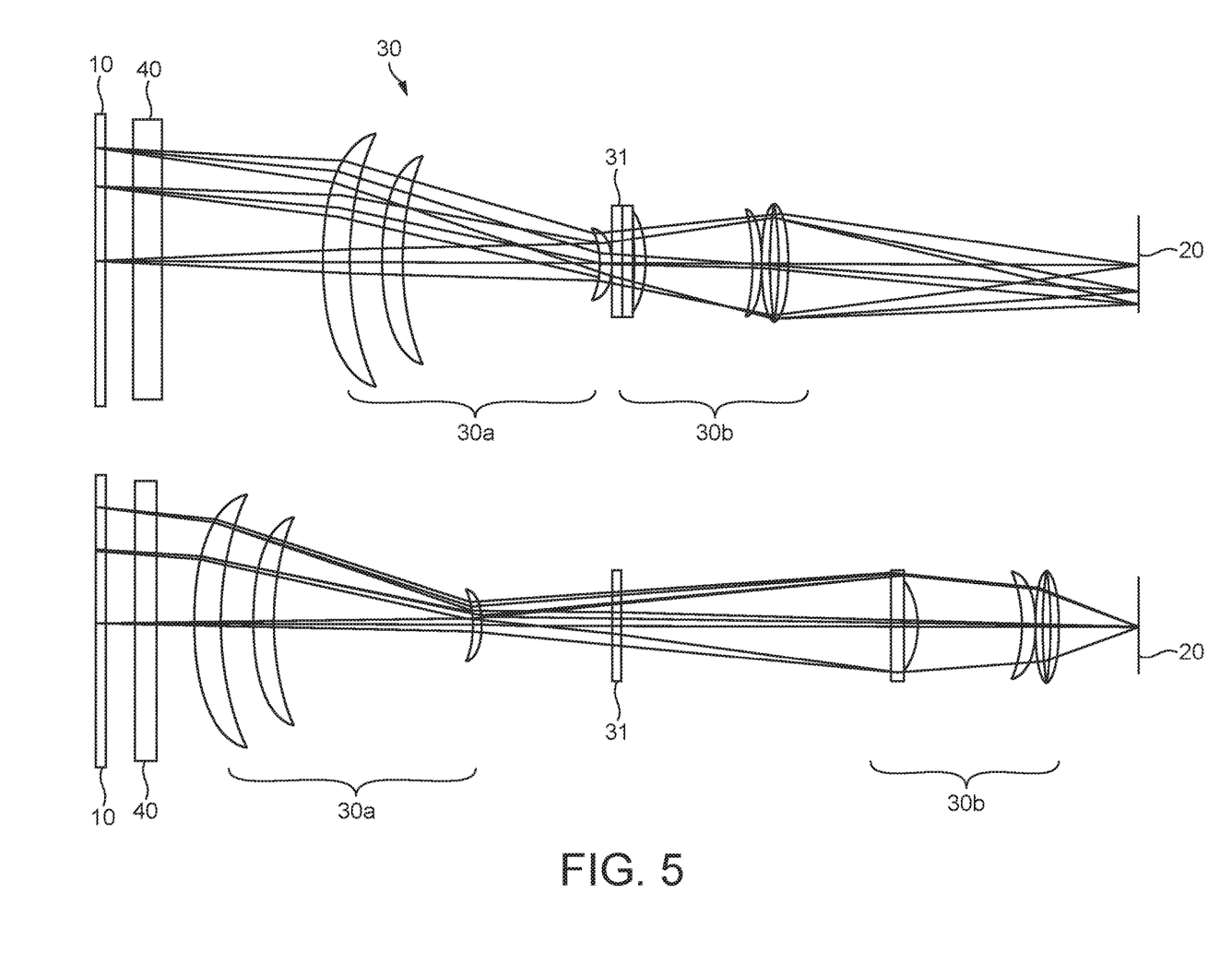
FIG. 5 shows a schematic representation of a possible arrangement of lenses within a lens assembly.

FIG. 5 shows schematically an arrangement of lens elements 30a, 30b of a lens assembly 30 in the first (top) and second (bottom) configurations. In this example, it can be seen that a focussing group of lens elements 30a and a zoom group of lens elements 30b can be moved to different positions in each configuration. Also shown in FIG. 5 is an optional iris 31 of the lens assembly 30.

Preferably, the actuator 32 is one or more stepper motors. However, a similar effect may be achieved using an actuator 32 formed from DC motors (and/or linear actuators) in combination with position encoders and/or image processing assisted focusing.

While it is preferred to actuate the lens assembly 30 in the manner set out above in order to achieve the correct amount of magnification/demagnification, it is also possible to reposition the image sensor 20 instead of, or as well as, the zoom group of lens elements (it may still be necessary to move the focus group of lens elements). For example, this would use the same one or more actuators 32.

In such an alternative embodiment, the image sensor 20 is movable from a first position in which the image sensor 20 and therefore the array is in a first location, and a second position in which the image sensor 20 and therefore the array is in a second location.

Furthermore, embodiments are envisioned in which both adjustment of the position of the image sensor 20 and re-configuration of the lens assembly 30 takes place to change the projection of the scintillation screen 10 onto the image sensor 20.

In either embodiment (i.e., irrespective of whether the lens assembly 30 changes configuration and/or the image sensor 20 moves), the image capture assembly 1 is configured to operate in at least a first configuration or a second configuration, wherein in the first configuration the lens assembly 30 projects the predefined region of the scintillation screen 10 onto the array of the image sensor 20, and in the second configuration the lens assembly 30 projects the predefined region of the scintillation screen 20 onto a sub-region 21 of the array of the image sensor 20.

In this way, a fixed field of view can be either projected onto the full image sensor 20, or a sub-region thereof. This can provide either a full-resolution (preferably high resolution) output image of the scintillation screen 10, or a low-resolution (a resolution that is lower than that of the full image sensor 20) output image of the scintillation screen 10. In the low-resolution case, the image can be formed with greater brightness and so the signal-to-noise ratio will be as good or better than digitally reducing the size of the image.

Preferably, the two configurations may be achieved without the need for an auto-focus, for example by use of a look-up table linking each configuration with position of one or more lens elements of the lens assembly 30 and/or of the image sensor 20. In some embodiments, auto-focusing could be used, such as image processing assisted focusing.

An image capture assembly 1 as described above may be arranged to operate in a first operating mode or a second operating mode.

In the first operating mode, the camera 25 operates at the first frame rate and the image capture assembly 1 is in the first configuration (e.g., the lens assembly 30 is in the first configuration and/or the image sensor 20 is in the first position).

In the second operating mode, the camera operates at the second frame rate and the variable lens assembly is in the second configuration (e.g., the lens assembly 30 is in the second configuration and/or the image sensor 20 is in the second position). The second frame rate is higher than the first frame rate.

Accordingly, this can provide either a full-resolution output image of the scintillation screen 10 at a low frame-rate, or a low-resolution output image of the scintillation screen 10 at a high frame-rate (a frame-rate that is higher than the low frame-rate).

Advantageously, CMOS sensors allow sub-arrays to be read. This is often known as a "Windowing mode". The frame readout speed can be significantly increased in the Windowing mode. This is not possible to the same degree with a CCD sensor and it is therefore preferable that the image sensor 20 is a CMOS sensor. Thus, where the sensor is a CMOS sensor, it can be windowed in the second operating mode so that the output image includes only data from the sub-region 21 of the array of the image sensor 20.

An image capture assembly 1 as described above may be arranged to operate in a third operating mode or a fourth operating mode, by using "binning" or "decimation" to reduce the resolution of the image output from the camera 25.

In the third operating mode, the camera 25 operates at the third frame rate and the image capture assembly 1 is in the first configuration (e.g., the lens assembly 30 is in the first configuration and/or the image sensor 20 is in the first position). In this configuration, although the field of view is projected onto the full array of the image sensor 20, the camera 25 (which preferably comprises a CMOS image sensor 20) outputs an output image having a resolution less than that of the array of the image sensor 20 (e.g., by binning or decimation of the image captured by the array). Preferably, the third frame rate is higher than the first frame rate.

In the fourth operating mode, the camera operates at the fourth frame rate and the variable lens assembly is in the second configuration (e.g., the lens assembly 30 is in the second configuration and/or the image sensor 20 is in the second position). In this configuration, as well as projecting the field of view onto the sub-region 21 of the array of the image sensor 20, the camera 25 (which preferably comprises a CMOS image sensor 20) outputs an output image having a resolution less than that of the sub-region 21 of the sub-array of the image sensor 20 (e.g., by binning or decimation of the image capture by the sub-array 21). Preferably, the fourth frame rate is higher than the second frame rate.

In the fourth operating mode, the image output by the camera is preferably up to 100 kilopixels, and more preferably 3 kilopixels to 4 kilopixels.

Advantageously, the use of a CMOS image sensor 20 (instead of a CCD image sensor) allows the binning or decimation to be carried out on the captured image (in the form captured by the image sensor 20) using hardware to thereby provide the reduced-resolution image data. That is, the camera 25 may comprise a processing means 26 for processing a signal from photo sensors of the image sensor 20 and providing output image data representative thereof. The processing means 26 may include an analogue to digital convertor. The binning or decimation may be carried out on the signal from the photo sensors before the analogue to digital convertor converts this to output image data. In other words, analogue to digital convertor receives the binned or decimated signals as an input.

While both CCD and CMOS sensors allow binning or decimation of adjacent pixels in order to reduce noise, in CMOS sensors this results in an even higher readout speed. The combination of the lens assembly 30, and the flexibility of the CMOS sensor to both "window" and "bin" or "decimate" the information from the image sensor 20 can provide a versatile capability to match the speed and resolution of the EBSD system to a particular application.

Figure 1:
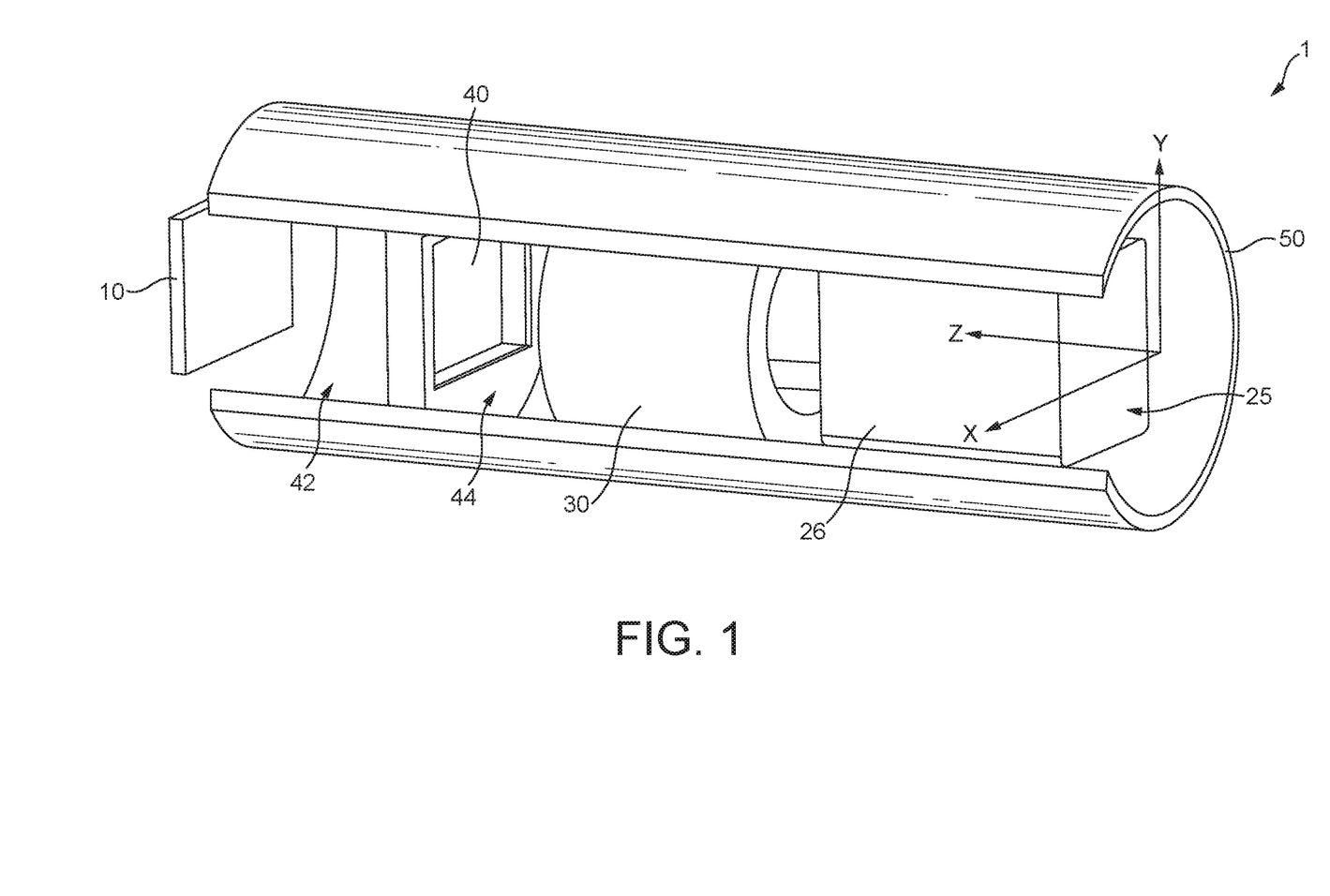
FIG. 1 shows a perspective view of an embodiment of an image capture assembly in accordance with the invention.
Figure 2:
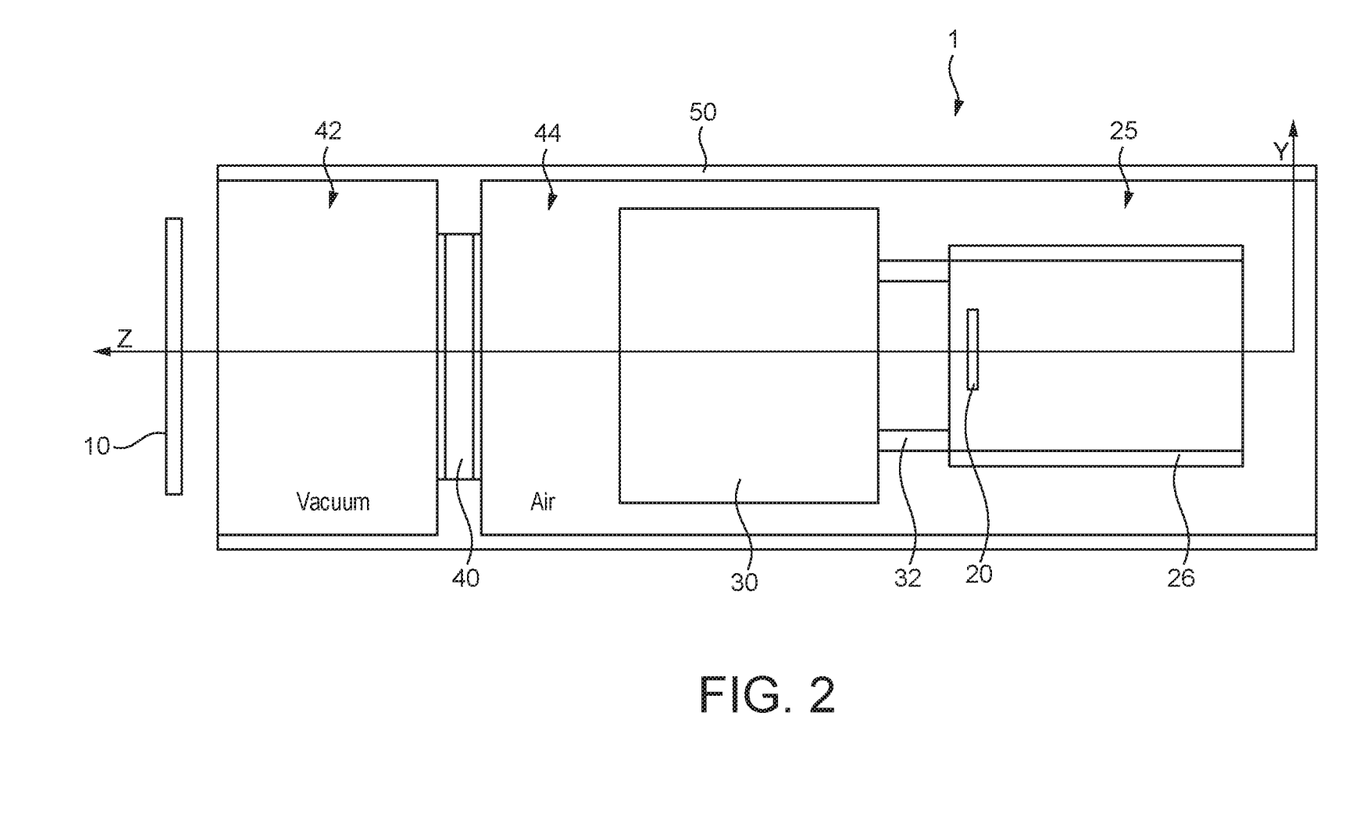
FIG. 2 shows a cross-sectional view of the image capture assembly of FIG. 1.

It is preferred that a housing 50 is provided, in which is held at least the scintillation screen 10, the lens assembly 30, and the camera 25. The housing 50 is preferably made from vacuum compatible material.

The housing may be 300-400 mm long, although this is not particularly limited. The housing is tubular with an internal diameter of about 40 mm to 60 mm, and preferably about 50 mm, which again is not particularly limited.

The housing 50 preferably comprises a window 40 between the scintillation screen 10 and the lens 30. The window 40 defines within the housing 50 a vacuum side 42 as in use this side is in communication with the evacuated analysis chamber of the EBSD system. The region 44 on the other side of the window 40 need not be sealed. The window 40 preferably comprises or is formed of lead glass or other vacuum compatible and radiation protective transparent material. For example, the window may be glass with an active phosphor layer formed thereon.

In the example shown, there is a wall in the housing 50 and the window 40 is provided in the wall. However, the window 40 may form the entire wall.

The vacuum side 42 of the housing 50 encompasses the scintillation screen 10. Preferably, the vacuum side 42 is arranged such that it may be placed in communication with the evacuated analysis chamber of the EBSD system (i.e., that which houses the sample) and/or directly connected to the same vacuum pump. Preferably, the scintillation screen 10 is in the range of 1 mm to 50 mm from the window 40. More preferably, the scintillation screen 10 is at most 15 mm from the window 40. Most preferably, the scintillation screen 10 is at most 10 mm from the window 40. For example, the scintillation screen 10 is 3 mm from the window 40.

The side 44 of the housing 50 extends from the window 40 away from the vacuum side 42. This "air" side 44 holds the variable lens assembly 30 and preferably also holds the camera 25. The air side 44 typically is at atmospheric pressure as it is not sealed against the atmosphere. In some embodiments, the air side 44 may not be filled with air but rather that space of the housing 50 that surrounds the lens assembly 30 and, optionally, the camera 25 may be evacuated.

The housing 50 is preferably generally cylindrical, such as tubular. Preferably, the actuator 32 is outside the housing 50. In some embodiments, the actuator could be inside the housing.

While the image capture assembly has been described in the context of an EBSD system, it will be appreciated that the assembly may be useful in other applications that comprise the use of an image screen (such as, but not limited to, a scintillation screen), which is to be imaged onto an image sensor. The incident radiation on the image screen may therefore be either electrons, ions, x-rays or neutrons for example. Other example applications include TEM diffraction, reflection high-energy electron diffraction, etc.

The invention claimed is:

1. An image capture assembly comprising:
a scintillation screen including a predefined screen region;
an image sensor comprising an array of photo sensors; and a lens assembly,
wherein:
the lens assembly is configured to operate in at least a first configuration and a second configuration;
in the first configuration the lens assembly projects an image of the predefined region of the scintillation screen onto the array; and
in the second configuration the lens assembly projects a demagnified image of the predefined region of the scintillation screen onto a sub-region of the array.

2. The image capture assembly of claim 1, wherein a field of view of the lens assembly is the same while the image capture assembly is in the first configuration and in the second configuration.

3. The image capture assembly of claim 1, wherein:
the lens assembly is a variable focal length lens assembly;
in the first configuration the variable focal length lens assembly is in a first arrangement that projects the image of the predefined region of the scintillation screen onto the array; and
in the second configuration the variable focal length lens assembly is in a second arrangement that projects the demagnified image of the predefined region of the scintillation screen onto the sub-region of the array.

4. The image capture assembly of claim 3, wherein:
the variable focal length lens assembly comprises one or more actuators for varying the lens assembly between the first arrangement and the second arrangement;
the image capture assembly is arranged to automatically actuate the actuator to vary the effect of the variable lens assembly.

5. The image capture assembly of claim 4, wherein:
the sensor is movable;
in the first configuration the sensor is in a first location; and in the second configuration the sensor is in a second location.

6. The image capture assembly of claim 1, comprising a camera that includes the image sensor and is operable at least a first frame rate and a second frame rate, the second frame rate being higher than the first frame rate.

7. The image capture assembly of claim 6, wherein pixels of the sensor are windowed and/or binned or decimated when the camera is operated at the second frame rate.

8. The image capture assembly of claim 6, wherein pixels of the sensor are windowed when the image capture assembly operates in the second configuration so as to output the sub-region of the array.

9. The image capture assembly of claim 6, wherein:
the image capture assembly is arranged to operate in at least a first operating mode or a second operating mode;
in the first operating mode the camera operates at the first frame rate and the image capture assembly is in the first configuration; and
in the second operating mode the camera operates at the second frame rate and the image capture assembly is in the second configuration.

10. The image capture assembly of claim 9, wherein:
the image capture assembly is arranged to operate in a third operating mode; and in the third operating mode:
the camera operates the image capture assembly in the first configuration;
the camera operates at a frame rate greater than the first frame rate; and
the image capture assembly outputs an image having a resolution lower than the array.

11. The image capture assembly of claim 1, further comprising a housing containing the scintillation screen, the lens assembly, and the camera, wherein:
the housing comprises a window between the scintillation screen and the lens assembly;
the window divides the housing such that a first chamber is provided between the scintillation screen and the window and a second chamber extends from the window away from the first chamber;
a vacuum is formed within the first chamber; and
the second chamber holds the lens assembly and the camera.

12. The image capture assembly of claim 1, wherein the lens assembly further comprises an iris, and in the second configuration the iris has a larger aperture than in the first configuration.

13. An image capture method for an EBSD system, the method comprising the steps of:
projecting light from a predefined screen region of a scintillation screen onto an image sensor comprising an array of photo sensors using a lens assembly in a first configuration, and capturing an image of the predefined screen region using the array;
changing the configuration of the lens assembly from the first configuration to a second configuration; and
projecting light from the predefined screen region onto a sub-region of the array of photo sensors using the lens assembly in the second configuration, and capturing a demagnified image of the predefined screen region using the sub-region of the array.

14. The method of claim 13, further comprising the steps of directing an electron beam onto a sample so that scattered electrons impinge upon the scintillation screen.

15. The method of claim 13, wherein the step of changing the configuration of the lens assembly from the first configuration to a second configuration comprises actuating one or more actuators to vary the effect of the variable lens assembly.

16. The method of claim 13, wherein the step of capturing an image using the sub-region of the array comprises windowing the image sensor.

17. The method of claim 13, wherein:
the step of capturing the image using the array comprises operating the camera at a first frame rate;
the step of capturing the demagnified image using the sub-region of the array comprises operating the camera at a second frame rate; and
the second frame rate is higher than the first frame rate.

18. The method of claim 17, further comprising the steps of:
projecting light from a predefined screen region of a scintillation screen onto an image sensor comprising an array of photo sensors using a lens assembly in a first configuration;
capturing the image using the array; and
outputting the image having a resolution lower than the array at a third frame rate, the third frame rate being higher than the first frame rate.

19. The method of claim 17, further comprising the steps of:
projecting light from the predefined screen region onto a sub-region of the array of photo sensors using the lens assembly in the second configuration;
capturing the demagnified image using the sub-region of the array; and
outputting the demagnified image having a resolution lower than the sub-region of the array at a fourth frame rate, the fourth frame rate being higher than the second frame rate.

20. The method of claim 13, wherein the lens assembly further comprises an iris, and in the second configuration the iris has a larger aperture than in the first configuration.

* * * * *